United States Patent
Nogami et al.

(10) Patent No.: US 7,598,479 B2
(45) Date of Patent: Oct. 6, 2009

(54) CIRCUIT FOR VARYING GAIN OF PREAMPLIFIER

(75) Inventors: Masamichi Nogami, Tokyo (JP); Masaki Noda, Tokyo (JP); Hitoyuki Tagami, Tokyo (JP); Kuniaki Motoshima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 483 days.

(21) Appl. No.: 10/566,240

(22) PCT Filed: Jul. 30, 2003

(86) PCT No.: PCT/JP03/09682

§ 371 (c)(1),
(2), (4) Date: Apr. 13, 2006

(87) PCT Pub. No.: WO2005/013480

PCT Pub. Date: Feb. 10, 2005

(65) Prior Publication Data

US 2006/0226913 A1    Oct. 12, 2006

(51) Int. Cl.
*H03F 3/08* (2006.01)
(52) U.S. Cl. ............... 250/214 A; 250/214 AG; 398/210; 330/308
(58) Field of Classification Search ......... 250/214 A, 250/214 AG; 327/179; 398/202, 208, 210; 330/308
See application file for complete search history.

(56) References Cited

U.S. PATENT DOCUMENTS

| | | | |
|---|---|---|---|
| 5,748,302 A | 5/1998 | Unno | |
| 6,140,878 A | 10/2000 | Masuta | |
| 6,246,282 B1 | 6/2001 | Oono et al. | |
| 6,909,082 B2 * | 6/2005 | Doh et al. ............. | 250/214 AG |
| 6,911,644 B2 * | 6/2005 | Doh et al. ............. | 250/214 AG |
| 6,933,786 B1 * | 8/2005 | Mohandas et al. .......... | 330/308 |
| 7,218,865 B2 * | 5/2007 | Doh et al. .................... | 398/202 |

FOREIGN PATENT DOCUMENTS

| | | |
|---|---|---|
| JP | 09-093278 | 4/1997 |
| JP | 09-098180 | 4/1997 |
| JP | 09-214537 | 8/1997 |
| JP | 2000-252774 | 9/2000 |
| JP | 2000-315923 | 11/2000 |
| JP | 2001-144552 | 5/2001 |
| JP | 2001-196877 | 7/2001 |
| JP | 03/071674 | 8/2003 |
| JP | 2004-242194 | 8/2004 |

OTHER PUBLICATIONS

English translation for JP 2000-315923.*

* cited by examiner

*Primary Examiner*—Stephen Yam
(74) *Attorney, Agent, or Firm*—Oblon, Spivak, McClelland, Maier & Neustadt, L.L.P.

(57) ABSTRACT

A gain switching circuit switches a conversion gain of a preamplifier that is configured with a series circuit formed with a first resistor and a first switching element and a series circuit formed with a second resistor and a second switching element respectively connected in parallel with a feedback resistor. The gain switching circuit includes a first operating unit that generates a first switching element operating signal for closing the first switching element within a first gain switching period, and a second operating unit that generates a second switching element operating signal for closing the second switching element within a second gain switching period.

9 Claims, 11 Drawing Sheets

CIRCUIT FOR VARYING GAIN OF PREAMPLIFIER

TECHNICAL FIELD

The present invention relates to a preamplifier used in a photoreceiver of an optical communications system or in a photoreceiving unit of an optical signal measuring apparatus, monitor, etc., and more particularly, to a gain switching circuit for the preamplifier.

BACKGROUND ART

An asynchronous transfer mode-passive optical network (ATM-PON) system is known as an example of an optical communications system.

The ATM-PON system is an optical communications system that has been internationally standardized by the ITU-T Recommendations G.983, and because it can realize point/multipoint transmission that enables a single optical line termination to communicate with a plurality of optical network units by a time division multiplex method, it is anticipated as a system that enables significant reductions in transmission costs.

With the ATM-PON system, because signals sent from the optical network units to the optical line termination are time division multiplexed and the optical network units and the optical line termination are connected at different distances according to subscribers, a receiver of the optical line termination unavoidably receives packet signals that vary greatly in signal intensity.

As with a general receiver, with the receiver of the ATM-PON system, an amplifier called a preamplifier (hereinafter, "preamp") that increases the signal intensity of a received signal to a required level is incorporated at a prestage of the receiver.

Though a preamp has a predetermined dynamic range, its own gain must be controlled in some form in order to receive signals of a wide intensity distribution from weak signals to strong signals as in the ATM-PON system. Preamps of the ATM-PON system and other optical communications systems thus have gain switching circuits in many cases (see Patent Document 1, etc.).

Patent Document 1
Japanese Patent Application Laid-Open No. 2000-315923
Patent Document 2
Japanese Patent Application Laid-Open No. 2001-144552
Patent Document 3
Japanese Patent Application Laid-Open No. 2000-252774

The Patent Document 1 discloses a burst photoreceiving circuit that switches a feedback gain of a transimpedance amp instantaneously in accordance with a power level of an input signal.

The photoreceiving circuit performs control so that a conversion gain of the transimpedance amp is set to an intrinsic gain of the amp when an output level of the transimpedance amp is equal to or less than a reference voltage V1, the conversion gain of the transimpedance amp is lowered when the output level exceeds the reference voltage V1 and is equal to or less than a reference voltage V2 (V2>V1), and the conversion gain of the transimpedance amp is lowered further when the reference voltage V2 is exceeded.

However, because the photoreceiving circuit is arranged so that a switching element performs an ON operation whenever the output amplitude of the transimpedance amp exceeds a reference voltage, when the input signal waveform contains any of various waveform distortions, such as ringing, amplitude fluctuation, and signal sag, the gain switching is not necessarily performed at the head of the input signal and it cannot be predicted at which bit position in the input signal the gain switching will occur. The following of a threshold value was thus difficult.

Also, due to such waveform distortions, an erroneous conversion gain is set or an unintended conversion gain is set.

An object of the present invention is thus to provide a preamp gain switching circuit that can switch to an appropriate conversion gain according to the level of the input signal.

DISCLOSURE OF INVENTION

A gain switching circuit according to one aspect of the present invention switches a conversion gain of a preamplifier. The preamplifier outputs a voltage signal by amplifying an output current of a photo-detecting element that converts a burst optical signal into an electrical signal, being configured with a series circuit formed with a first resistor and a first switching element and a series circuit, formed with a second resistor and a second switching element respectively connected in parallel with a feedback resistor. The gain switching circuit inputs a first gain switching period for switching to a first conversion gain and a second gain switching period for switching to a second conversion gain from outside upon receiving an output from the preamp, including a first operating unit that generates a first switching element operating signal for closing the first switching element within the first gain switching period; and a second operating unit that generates a second switching element operating signal for closing the second switching element within the second gain switching period.

With the gain switching circuit according to the present invention, upon receiving the output of the preamp, with which the series circuit, formed with the first resistor and the first switching element, and the series circuit, formed with the second resistor and the second switching element, are connected in parallel to the feedback resistor, and which outputs the voltage signal upon amplifying the output current of the photo-detecting element that converts the burst-form optical signal into the electrical signal, the first gain switching period of switching to the first conversion gain and the second gain switching period of switching to the second conversion gain are input from the exterior, the first operating unit generates the first switching element operating signal for closing the first switching element within the first gain switching period, and the second operating unit generates the second switching element operating signal for closing the second switching element within the second gain switching period.

A gain switching circuit according to another aspect of the present invention switches a conversion gain of a preamplifier. The preamplifier outputs a voltage signal by amplifying an output current of a photo-detecting element that converts a burst optical signal into an electrical signal, being configured with a series circuit formed with a first resistor and a first switching element and a series circuit, formed with a second resistor and a second switching element respectively connected in parallel with a feedback resistor. The gain switching circuit includes a gate generating circuit that, upon receiving the output of the preamp, generates a gate signal for switching to a predetermined conversion gain within a gain switching period; a first operating unit that generates a first switching element operating signal for closing a first switching element within the gain switching period; and a second operating unit that generates a second switching element operating signal for closing a second switching element within the gain switching period.

With the gain switching circuit according to the present invention, upon receiving the output of the preamp, with which the series circuit, formed with the first resistor and the first switching element, and the series circuit, formed with the second resistor and the second switching element, are connected in parallel to the feedback resistor, and which outputs the voltage signal upon amplifying the output current of the photo-detecting element that converts the burst-form optical signal into the electrical signal, the gate generating circuit generates the gate signal for switching to the predetermined conversion gain-within the gain switching period, the first operating unit generates the first switching element operating signal for closing the first switching element within the gain switching period, and the second operating unit generates the second switching element operating signal for closing the second switching element within the gain switching period.

BEST MODE(S) FOR CARRYING OUT THE INVENTION

Exemplary embodiments of a preamp gain switching circuit according to the present invention will be explained in detail with reference to the attached drawings.

First Embodiment

Figure 1:
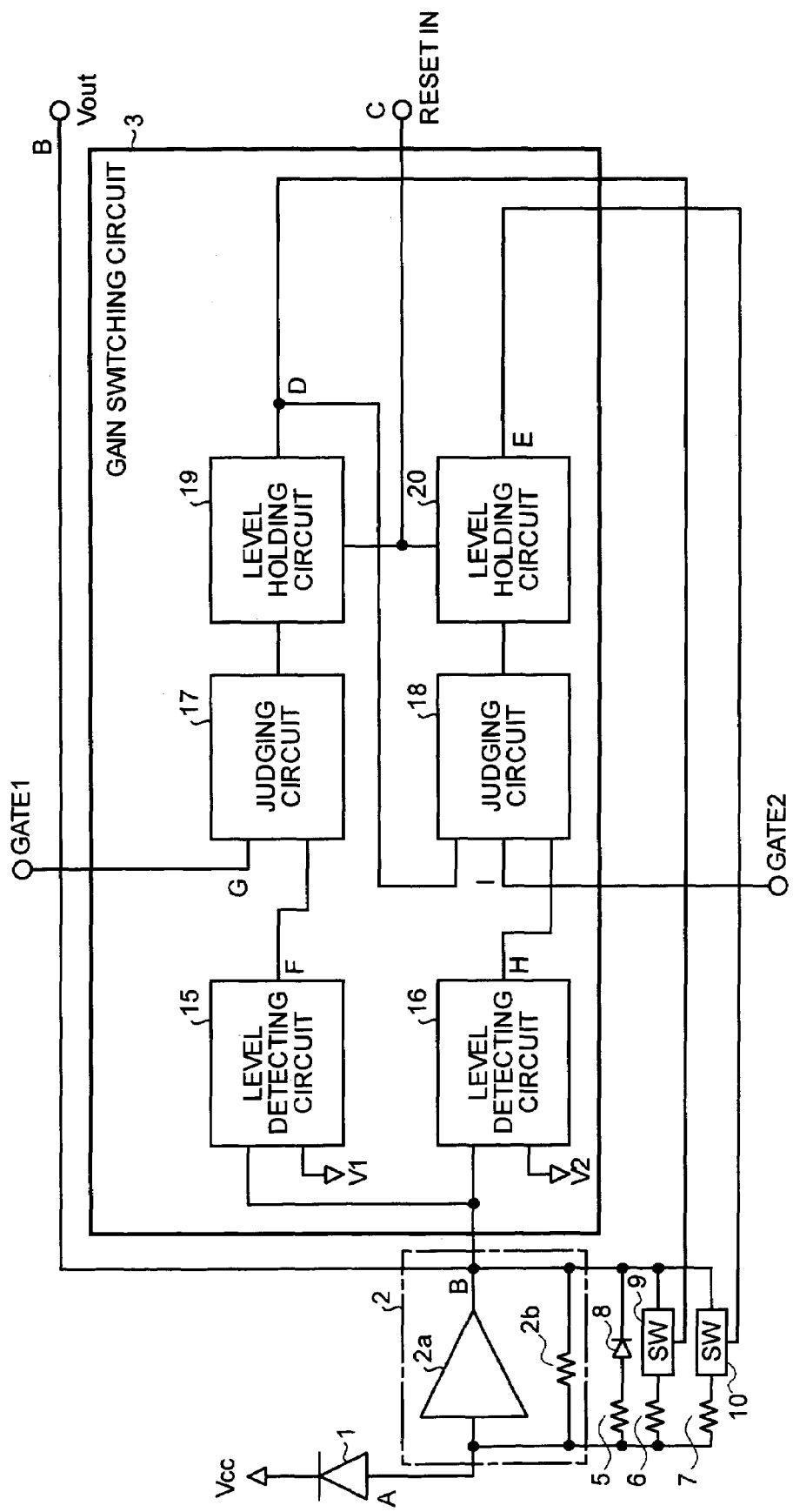
FIG. 1 is a block diagram of an arrangement of a preamp gain switching circuit according to a first embodiment of the present invention.

FIG. 1 is a block diagram of an arrangement of a preamp gain switching circuit according to a first embodiment of the present invention. In FIG. 1, a preamp 2 that receives an output (current signal) A of a photo-detecting element 1, which converts an optical signal to an electrical signal, is a transimpedance amp (TIA) that outputs a voltage signal upon amplifying the input current signal and is arranged from an operational amp 2a and a feedback resistor 2b. A series circuit, formed with a resistor 5 and a diode 8, a series circuit, formed with a resistor 6 and a switching element 9 (hereinafter, "SW 9"), and a series circuit, formed with a resistor 7 and a switching element 10 (hereinafter, "SW 10"), are connected in parallel to the feedback resistor 2b of the TIA 2.

The series circuit, formed with the resistor 5 and the diode 8, may not be provided in some cases. In consideration of the series circuit, formed with the resistor 5 and the diode 8, the conversion gain of the TIA 2 when the SWs 9 and 10 are in the OFF operation state will be either the gain determined by the value of the feedback resistor 2b or the gain determined by the parallel resistance of the feedback resistor 2b and the resistor 5. Here, in order to facilitate the explanation, the series circuit, formed with the resistor 5 and the diode 8, will be ignored and the gain determined by the value of the feedback resistor 2b will be deemed to be the intrinsic conversion gain of the TIA 2.

The gain switching circuit 3 of the present embodiment has level detecting circuits 15 and 16, judging circuits 17 and 18, and level holding circuits 19 and 20, performs gain switching at a specific bit position of a burst-form packet signal by restricting a gain switching period by two gate signals of GATE1, which is a first gate signal, and GATE2, which is a second gate signal, and when a different cause of gain switching occurs thereafter, performs gain switching at another specific bit position upon judging whether a preceding gain switching operation was performed. That is, in performing gain switching, a solitary switching operation is not performed but gain switching is performed at another specific bit position always under the condition that a preceding gain switching operation was performed. Switching to an appropriate conversion gain in accordance with the level of each packet signal is performed by such gain switching.

In FIG. 1, the output (voltage signal) B of the TIA 2 is input into one input terminal of each of the level detecting circuits 15 and 16. A discrimination level V1, which is a first discrimination level, is input into the other input terminal of the level detecting circuit 15. A discrimination-level V2, which is a second discrimination level, is input into the other input terminal of the level detecting circuit 16.

An output F of the level detecting circuit 15 is input into one input terminal of the judging circuit 17. An output signal G of the first gate signal (GATE1) is input into the other input terminal of the judging circuit 17. Likewise, an output H of the level detecting circuit 16 is input into a first input terminal of the judging circuit 18. An output signal I of the second gate signal (GATE2) is input into a second input terminal of the judging circuit 18 and an output D of the level holding circuit 19, into which the output of the judging circuit 17 is input, is input into a third input terminal of the judging circuit 18. The output of the judging circuit 18 is input into the level holding circuit 20. The output D of the level holding circuit 19 becomes a control signal of the SW 9 and an output E of the level holding circuit 20 becomes a control signal of the SW 10.

Meanwhile, a reset signal (RESET) C is input from the exterior into each of the level holding circuits 19 and 20. Because the reset signal (RESET) C is input before the input of each packet signal, the level holding circuits 19 and 20 are initialized at the head of each packet signal. The SWs 9 and 10 are thus put in the OFF state at the head of each packet signal.

Figure 2:
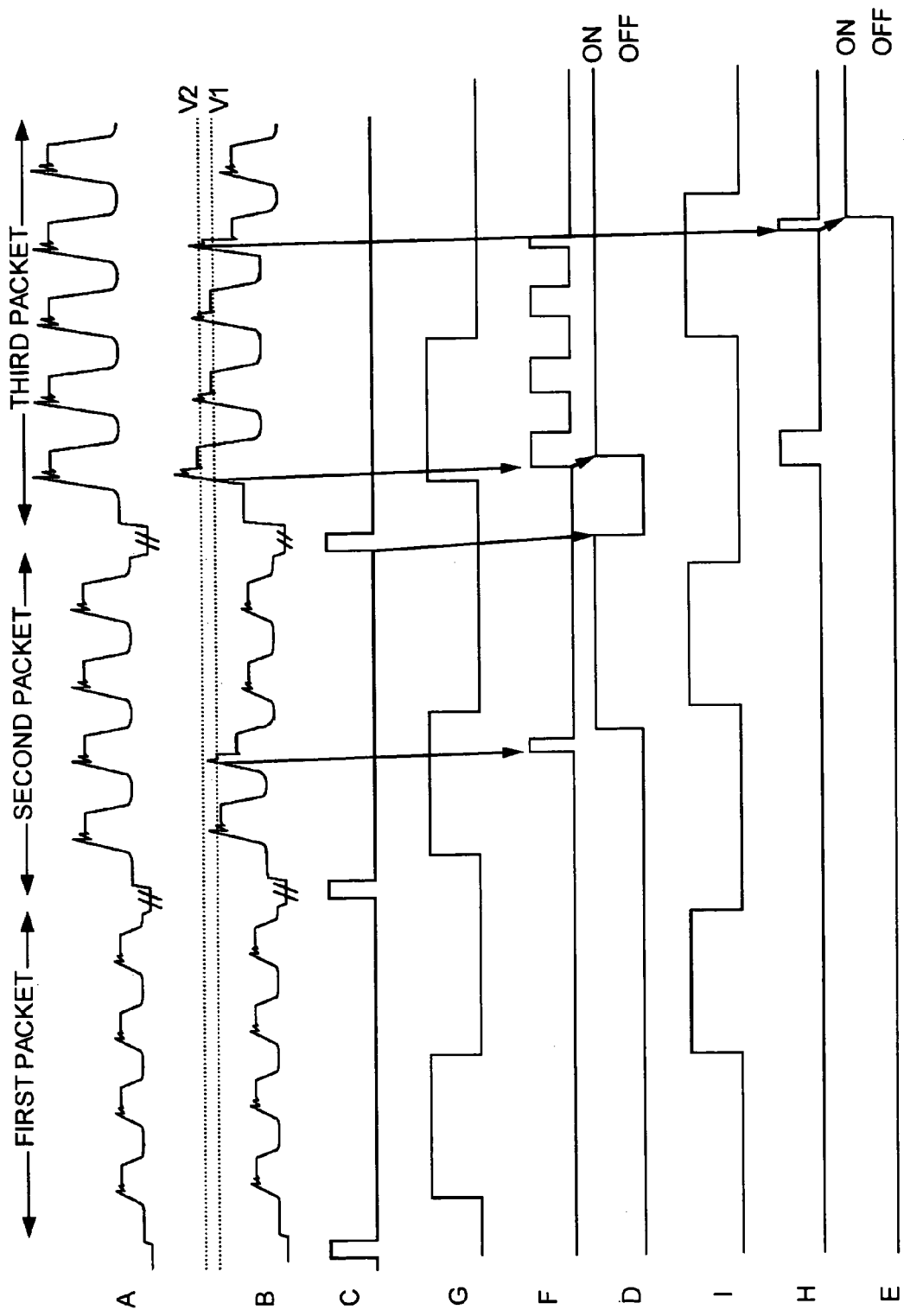
FIG. 2 is a timing chart for explaining operations of the gain switching circuit 3 shown in FIG. 1.

FIG. 2 is a timing chart for explaining operations of the gain switching circuit 3 shown in FIG. 1. FIG. 2 depicts an example in which, when a bit pattern of each of burst-form packet signals (a first, a second, and a third packet signal) is "1010 . . . ," gain switching is performed in a first gain switching period (output period of the GATE1 signal) and when a cause of gain switching then occurs in a second gain switching period (output period of the GATE2 signal), instead of performing a solitary switching operation, gain switching in the second gain switching period is performed always under the condition that a gain switching operation was performed in the first gain switching period.

The operations of the gain switching circuit shown in FIG. 1 will now be explained with reference to FIGS. 1 and 2. "A" of FIG. 2 depicts an output current waveform of the photodetecting element 1, that is, the current waveform input into the TIA 2, and the waveform's amplitude increases in the order of the first packet, the second packet, and the third packet. Each of the first packet, the second packet, and the third packet is a data signal with the bit pattern of "1010 . . . ," and with each packet signal, the rising portion of each of the "1" bits accompanies a large ringing or other waveform distortion.

"B" of FIG. 2 is a diagram of a waveform of output voltage (Vout) B that is output from the TIA 2 when the respective packet signals shown in "A" of FIG. 2 are input, and discrimination levels (V1 and V2) are indicated on the waveform. For the first packet, the output voltage (Vout) B of the TIA 2 is of a level less than the discrimination level V1. For the second packet, the output voltage (Vout) B of the TIA 2 is of a level that just barely reaches the discrimination level V1. For the third packet, the output voltage (Vout) B of the TIA 2 is of a level that exceeds the discrimination level V2. The discrimination levels V1 and V2 are not necessarily in the relationship, V1<V2. That is, as will be clear from the explanation that follows, the comparison with the discrimination level V2 is carried out on a packet signal that is lowered in amplitude upon comparison of the output voltage (Vout) B of the TIA 2 with the discrimination level V1 and the consequent lowering of the gain by the turning ON of the SW 9. If by the comparison with the discrimination level V1, the SW 9 turns ON and the amount of the consequent lowering of the gain is k (k>1), it is sufficient that the V2 be in the relationship, V1<kV2, with respect to the V1.

"C" of FIG. 2 depicts a waveform of the reset signal (RESET) C. As shown in "C", the reset signal (RESET) C is input at the head of each of the first, the second, and the third packets. By this input, the level holding circuits 19 and 20 are set to the initialized state at the head of each packet signal. Also, at the head of each packet signal, the SWs 9 and 10 are in the OFF state. Thus, at the head of each packet signal, the TIA 2 is set to the intrinsic conversion gain of the TIA 2 determined by the feedback resistor 2b.

"G" of FIG. 2 is a waveform diagram of the first gate signal (GATE1) G. With the example of "G", a signal of a level of "1" is output from the head (before a first bit) to a fourth bit of each packet signal, and whether to perform gain switching is judged within the "1" level period. The output period of the first gate signal is not restricted to the present example and is determined in combination with the second gate signal (the gate signals are set so that at least the output periods do not overlap).

"I" of FIG. 2 is a waveform diagram of the second gate signal (GATE2) I. With the example of "I", a signal of a level of "1" is output from a fifth bit to an eighth bit of each packet signal, and as with the first gate signal, whether to perform gain switching is judged within the "1" level period.

"F" of FIG. 2 is a waveform diagram depicting operations of the level detecting circuit 15. For the first packet of the example shown in "B", because the level is less than the discrimination level V1, the level of the output F of the level detecting circuit 15 is "0." Meanwhile, for the second packet, because the waveform amplitude just barely reaches the discrimination level V1, a pulse is not generated at the first bit, and a pulse for the period in which the discrimination level V1 is exceeded is generated at a third bit. For the third packet, because the signal exceeds the discrimination level V1, pulses are generated from the first bit. For a third bit and onward of the packet signal, a new, lowered conversion gain is applied and the amplitude of the packet signal drops. The packet signal that is thus lowered in amplitude is compared in likewise manner with the discrimination level V1 and because the discrimination level V1 is still exceeded, pulses are output for the periods in which the discrimination level V1 is exceeded as shown in "F".

"H" of FIG. 2 is a waveform diagram depicting operations of the level detecting circuit 16. For the first and the second packets of the example shown in "B", because the level is less than the discrimination level V2, the level of the output H of the level detecting circuit 16 is "0." Meanwhile, for the third packet, because the signal exceeds the discrimination level V2, a pulse is generated from the first bit. Though the packet that is lowered in amplitude by the new conversion gain is compared with the discrimination level V2 in the same manner as the comparison with the discrimination level V1, because the signal at this point has a waveform amplitude that just barely reaches the discrimination level V2, a pulse is not generated at the third bit and a fifth bit, and at a seventh bit, it is judged that the discrimination level V2 is exceeded and a pulse is generated for the period in which the discrimination level V2 is exceeded.

"D" of FIG. 2 is a waveform diagram depicting operations of the judging circuit 17 and the level holding circuit 19. For the first packet, because the discrimination level V1 is not exceeded, there is no output from the level detecting circuit 15 to the judging circuit 17. Also, the TIA 2 performs amplification by the intrinsic conversion gain on the first packet.

Meanwhile, for the second packet, a detection pulse signal F is input into the judging circuit 17. The judging circuit 17 outputs an SW controlling signal to the level holding circuit 19 only when the detection pulse signal F is input within the time width of the first gate signal G. The level holding circuit 19 provides the input SW controlling signal as an SW operating signal D to the SW 9, and holds the signal to keep the SW 9 in the ON state until the reset signal (RESET) C is input. At the TIA 2, switching from the intrinsic conversion gain to a new conversion gain, determined by the parallel resistance of the feedback resistor 2b and the resistor 6, is performed from the third bit for the second packet. For the third packet, because the first bit exceeds the discrimination level V1 and this furthermore occurs within the time width of the first gate signal G, the judging circuit 17 and the level holding circuit 20 operate in the same manner as for the second packet and keeps the SW 9 in the ON state.

"E" of FIG. 2 is a waveform diagram depicting operations of the judging circuit 18 and the level holding circuit 20. The judging circuit 18 outputs an SW controlling signal to the level holding circuit 20 only when the detection pulse signal H is input within the time width of the second gate signal I and the SW operation signal D of the level holding circuit 19 is output. The level holding circuit 20 provides the input SW controlling signal as an SW operating signal E to the SW 10, and holds the output until the reset signal (RESET) C is input. Here, at the TIA 2, switching to a new conversion gain, determined by the parallel resistance of the feedback resistor 2b, the resistor 6, and the resistor 7, is performed and the SW 10 is kept ON from the third packet.

Figure 3:
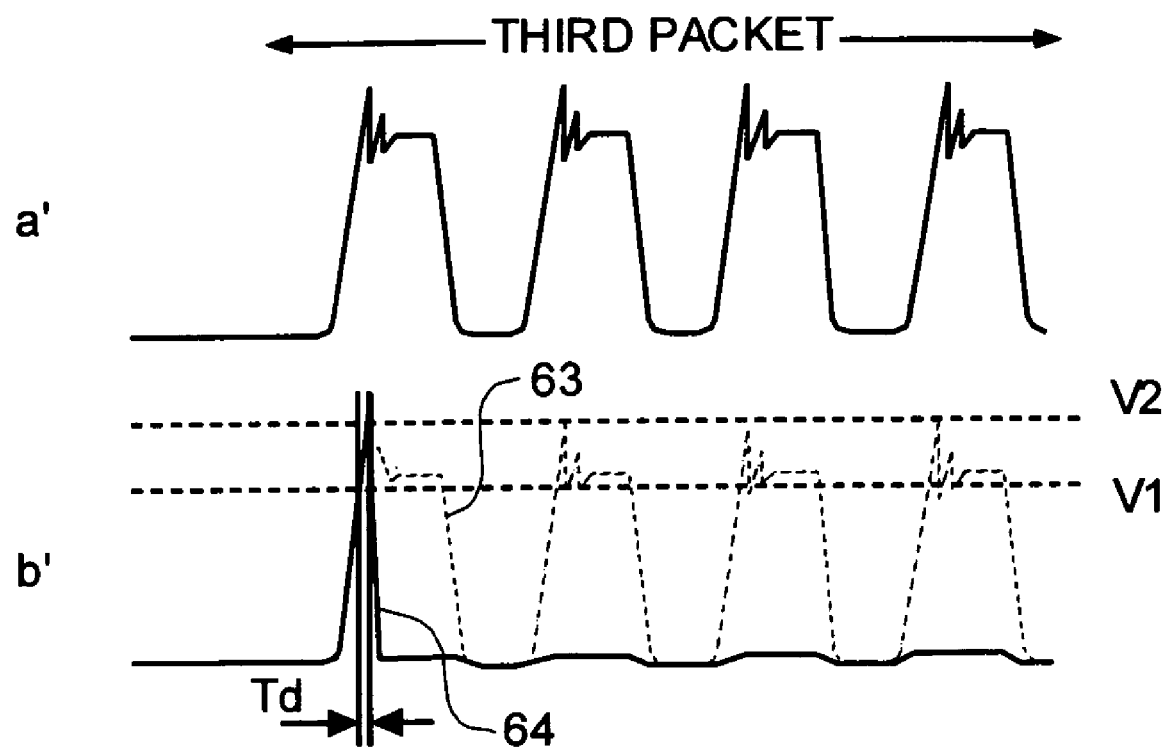
FIG. 3 is a diagram for explaining an operation fault of a preamp gain switching circuit, such as that explained in Patent Document 1.
Figure 4:
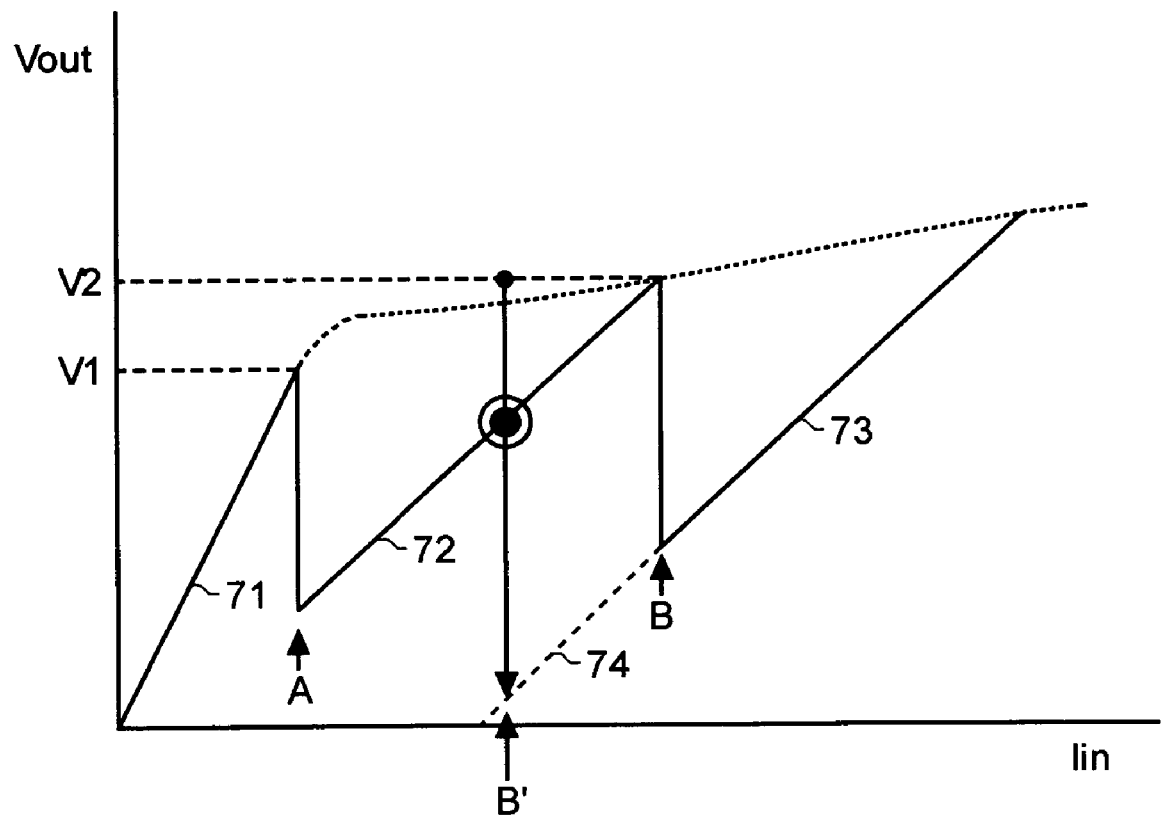
FIG. 4 is a diagram for explaining the operation fault of the gain switching circuit in terms of input/output characteristics of the preamp.

Problems concerning preamp gain switching circuits will now be explained. FIG. 3 is a diagram for explaining an operation fault of a preamp gain switching circuit, such as that explained in Patent Document 1, and FIG. 4 is a diagram of input/output characteristics of the preamp shown in FIG. 3.

With a conventional preamp gain switching circuit, if there are two discrimination levels, operations are generally carried out in a form in which the discrimination levels V1 and V2 are set in the relationship, V1<V2, a switching element corresponding to the SW 9 in FIG. 1 is turned ON when the discrimination level V1 is exceeded, and a switching element corresponding to the SW 10 in FIG. 1 is turned ON when the discrimination level V2 is exceeded. That is, the gain is lowered from an intrinsic gain to a first conversion gain when the discrimination level V1 is exceeded and the gain is lowered further to a second conversion gain lower than the first conversion gain when the discrimination level V2 is exceeded.

"a'" of FIG. 3 depicts a signal equivalent to the third packet shown in FIG. 2. In "b'" of FIG. 3, a waveform indicated by a dotted line 63 is an intended signal waveform, and a waveform indicated by a solid line 64 is a signal waveform that causes erroneous operation. If the signal waveform of the third packet is of a level that exceeds the discrimination level V1 but does not exceed the discrimination level V2, correct operation will be performed even by the conventional preamp.

However, with a waveform having a large signal sag Td as shown in "a'", because the discrimination level V2 is exceeded at the leading bit position of the pulse, an erroneous operation, in which the gain is lowered past the first conversion gain to the lower second conversion gain from the intrinsic gain, can occur.

FIG. 4 is a diagram for explaining the operation fault of the gain switching circuit in terms of the input/output characteristics of the preamp. In FIG. 4, characteristic 71 is an input/output characteristic when the preamp operates at the intrinsic gain. Characteristic 72 is an input/output characteristic when the preamp operates at the first conversion gain. Likewise, characteristic 73 is an input/output characteristic when the preamp operates at the second conversion gain. A gain switching point A is a point at which gain switching from the intrinsic gain to the first conversion gain is performed when the output signal exceeds the discrimination level V1, and a gain switching point B is the point at which gain switching from the first conversion gain to the second conversion gain is performed when the output signal exceeds the discrimination level V2.

Thus, with a waveform with a large signal sag such that the discrimination level V2 is exceeded at the leading bit position of the pulse as shown in "a'" of FIG. 3, control in accordance with characteristic 74 that starts from a gain switching point B' is performed instead of the proper control in accordance with the characteristic 72 that starts from gain switching point A. The output amplitude thus becomes smaller than the intended amplitude and a non-intended conversion gain is set.

However, with the gain switching circuit 3 of the TIA 2 of the present embodiment, even when a signal exceeding the discrimination level V2, such as the third packet shown in "A" of FIG. 2, is input, because the gain switching period is restricted by the two gate signals of the first and the second gate signals, an erroneous operation such as that seen with the conventional art will not occur. Also, even when a signal that just barely reaches the discrimination level V1, such as the second packet shown in "A" of FIG. 2, is input, because the first gate signal is provided with a width, accurate gain switching can be performed at the first 8 bits.

With the preamp gain switching circuit of the present embodiment, because upon receiving the output of the preamp, the first gain switching period of switching to the first conversion gain and the second gain switching period of switching to the second conversion gain are input from the exterior, a first operating unit generates the first switching element operating signal for closing the first switching element within the first gain switching period, and a second operating unit generates the second switching element operating signal for closing the second switching element within the second gain switching period, a preamp gain switching circuit that can perform accurate gain switching in the interval from the head bit to a bit of a predetermined number and can switch to an appropriate conversion gain according the level of the input signal can be provided.

With the preamp gain switching circuit of the present embodiment, because control is performed in a manner such that the second switching element can be closed by the second operating unit within the second gain switching period only after the first switching element has been closed by the first operating unit in the first gain switching period, control without gain switching error can be realized.

The first operating unit is realized by the judging circuit 17 and the level holding circuit 19, and the second operating unit is realized by the judging circuit 18 and the level holding circuit 20.

Though with the present embodiment, the output period of the first gate signal is set as being from the first bit to the fourth bit of each packet signal and the output period of the second gate signal is set as being from the fifth bit to the eighth bit of each packet signal, the present invention is not restricted thereto. For example, if the setting to the first conversion gain is to be made more accurate, the output period of the first gain signal may be made longer. Or, if the gain switching is to be performed rapidly, the overall output period of the first and the second gate signals may be shortened.

Second Embodiment

Figure 5:
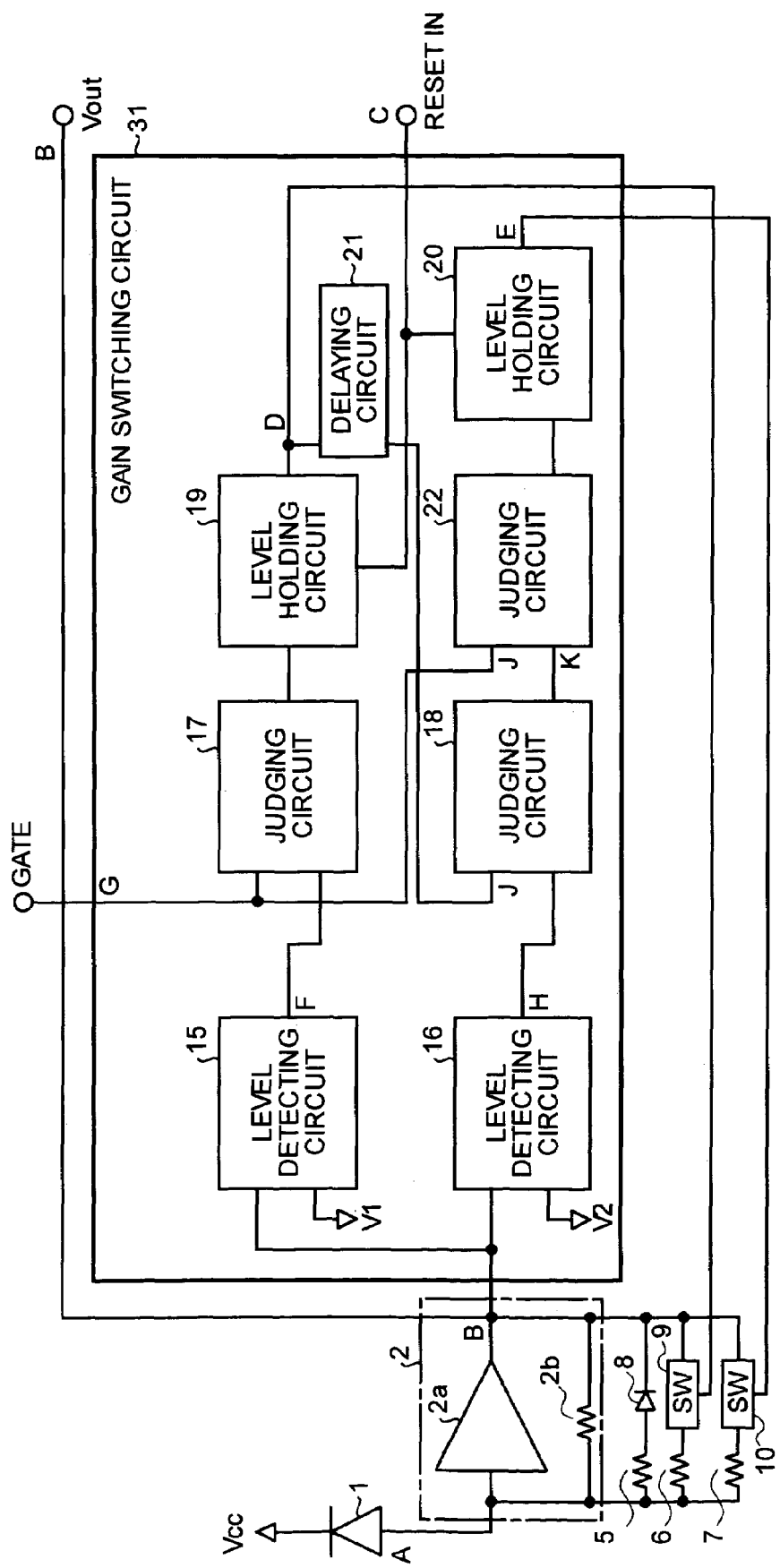
FIG. 5 is a block diagram of an arrangement of a preamp gain switching circuit according to a second embodiment of the present invention.

FIG. 5 is a block diagram of an arrangement of a preamp gain switching circuit according to a second embodiment of the present invention. With the gain switching circuit 31 shown in FIG. 5, the gain switching circuit 3 of FIG. 1 is provided with a delaying circuit 21 that delays the output of the level holding circuit 19 by one bit or more and the process of judging whether the discrimination level V2 is exceeded is performed in the two stages of the judging circuit 18 and a judging circuit 22. Besides these, the arrangement is the same as or equivalent to the arrangement of the gain switching circuit 3 of the first embodiment shown in FIG. 1 and the same symbols are provided to the respective parts. Also, whereas the two gate signals of the first gate signal and the second gate signal are used to perform discrimination with respect to the discrimination levels V1 and V2 in the first embodiment, the present embodiment differs in that a single gate signal is used to perform discrimination.

Figure 6:
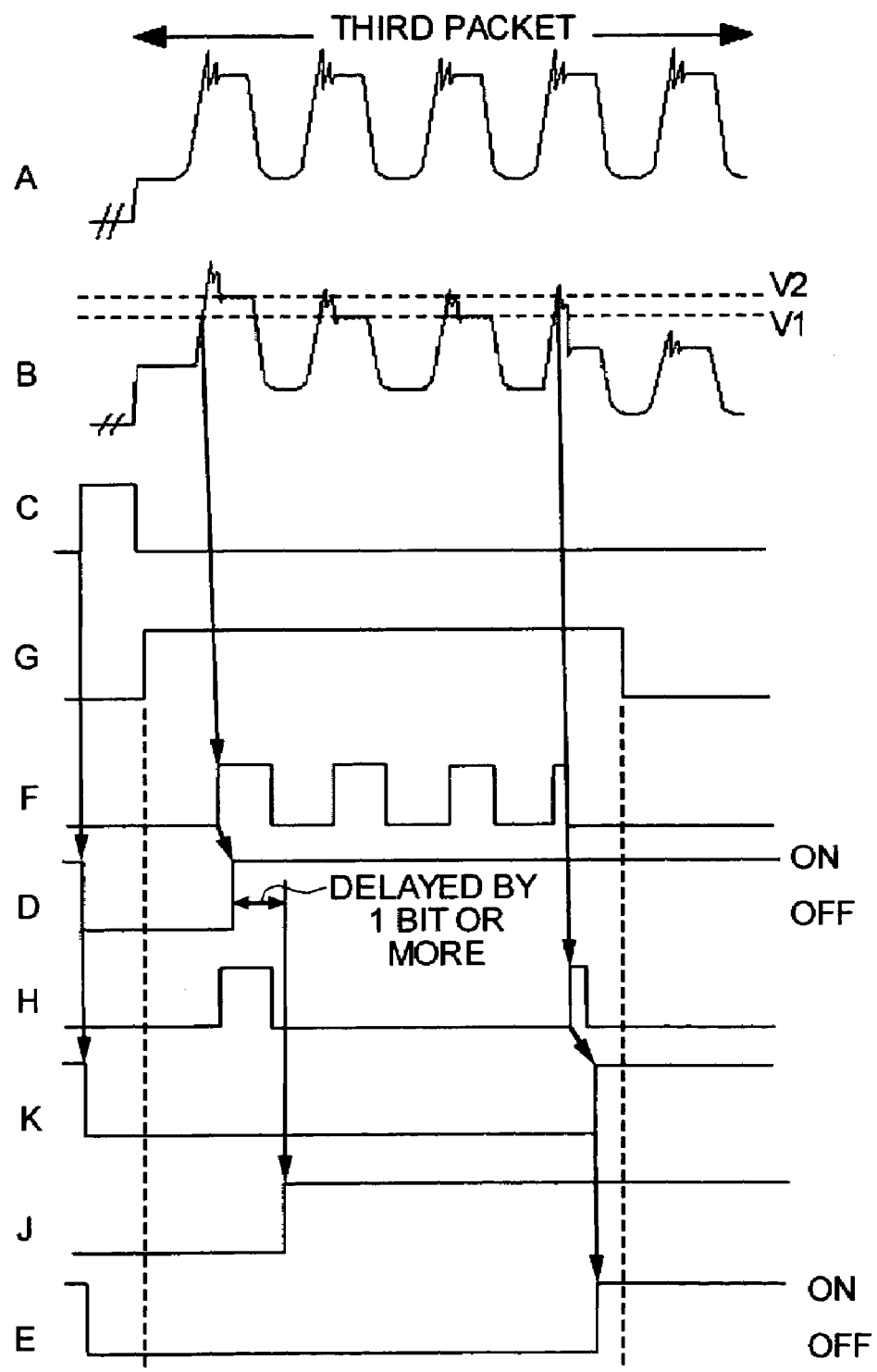
FIG. 6 is a timing chart for explaining operations of the gain switching circuit 31 shown in FIG. 5.

Operations of the gain switching circuit shown in FIG. 5 will now be described with reference to FIGS. 5 and 6. FIG. 6 is a timing chart for explaining the operations of the gain switching circuit 31 shown in FIG. 5. "A" of FIG. 6 depicts a current waveform that is input into the TIA 2 and here, the same signal train as the third packet shown in FIG. 2 is shown.

"B" of FIG. 6 depicts a waveform of the output voltage (Vout) B output from the TIA 2 when the third packet signal of "A" is input, and the discrimination levels (V1 and V2) are indicated on the waveform. For the third packet, the output voltage (Vout) B of the TIA 2 is of a level that exceeds the discrimination level V2. The relationship of the discrimination levels V1 and V2 is the same as that in the first embodiment, and it is sufficient that V1<kV2 be satisfied for k that satisfies k>1.

"C" of FIG. 6 depicts a waveform of the reset signal (RESET) C. As shown in "C", the reset signal (RESET) C is input at the head of the third packet. By this input, the level holding circuits 19 and 20 are set to the initialized state at the head of the third packet signal, and the SWs 9 and 10 are also in the OFF state at the head of the third packet signal. Thus, at the head of the third packet signal, the TIA 2 is set to the intrinsic conversion gain of the TIA 2 determined by the feedback resistor 2b.

"G" of FIG. 6 is a waveform diagram of the gate signal (GATE1) G. With the example of "G", a signal of a level of "1" is output from the head bit (before the first bit) to the eighth bit of each packet signal, and whether to perform gain switching is judged within the "1" level period. Whereas in the first embodiment, the interval from the first bit to the eighth bit is divided into the two gate signal output periods of the first gate signal output period from the first bit to the fourth bit and the second gate signal output period from the fifth bit to the eighth bit, with the present embodiment, the interval from the first bit to the eighth bit is set as the output period of a single gate signal.

"F" of FIG. 6 is a waveform diagram depicting operations of the level detecting circuit 15. For the third packet shown in "B", because the signal exceeds the discrimination level V1, a pulse is generated from the first bit. For the third bit onward of the packet signal, a new lowered conversion gain is applied and the amplitude of the packet signal drops. The packet signal that is thus lowered in amplitude is compared in likewise manner with the discrimination level V1 and as long as the discrimination level V1 is exceeded, pulses are output constantly.

"H" of FIG. 6 is a waveform diagram depicting operations of the level detecting circuit 16. For the third packet shown in "B", because the signal exceeds the discrimination level V1 and also exceeds the discrimination level V2, a pulse is generated from the first bit. Though the packet that is lowered in amplitude by the new conversion gain is compared with the discrimination level V2, because the signal at this point has a waveform amplitude that just barely reaches the discrimination level V2, a pulse is not generated at the third and the fifth bits, and at the seventh bit, a pulse is generated for the period in which the discrimination level V2 is exceeded.

"D" of FIG. 6 is a waveform diagram depicting operations of the judging circuit 17 and the level holding circuit 19. Because the third packet is a signal that exceeds the discrimination level V1, the detection pulse signal F is input into the judging circuit 17. The judging circuit 17 outputs the SW controlling signal to the level holding circuit 19 only when the detection pulse signal F is input within the time width of the gate signal G. The level holding circuit 19 provides the input SW controlling signal as the SW operating signal D to the SW 9 and holds the signal to keep the SW 9 in the ON state until the reset signal (RESET) C (not shown) is input. At the TIA 2, switching from the intrinsic conversion gain to the new conversion gain, determined by the parallel resistance of the feedback resistor 2b and the resistor 6, is performed from the third bit for the third packet.

"J" of FIG. 6 is a waveform diagram depicting operations of the delaying circuit 21. The delaying circuit 21 outputs a signal by which the SW operating signal D of the level holding circuit 19 is delayed by one bit or more and holds the signal until the next reset signal (RESET) C (not shown) is input. The delayed signal is input into one input terminal of the judging circuit 18.

"K" of FIG. 6 depicts an output of the judging circuit 18 into which the output H from the level detecting circuit 16 and the output J from the delaying circuit 21 have been input. The judging circuit 18 is arranged to generate an output pulse when the SW operating signal D is output and a detection pulse is generated in accordance with the discrimination level V2. However, when both a detection pulse due to the discrimination level V2 and a detection pulse due to the discrimination level V1 are output simultaneously as at the first bit of the third packet signal, an output pulse is prevented from being generated so that a gain switching error will not occur. The signal that is delayed by one bit or more is input into the judging circuit 18 also in order to prevent the occurrence of the switching error.

"E" of FIG. 6 is a waveform diagram depicting operations of the judging circuit 22 and the level holding circuit 20. The judging circuit 22 outputs an SW controlling signal to the level holding circuit 20 when the detection pulse signal K is input within the time width of the gate signal G. The level holding circuit 20 provides the input SW controlling signal as the SW operating signal E to the SW 10 and holds the output until the reset signal (RESET) C is input. Here, at the TIA 2, switching to the new conversion gain, determined by the parallel resistance of the feedback resistor 2b, the resistor 6, and the resistor 7, is performed and the SW 10 is kept, ON from the ninth bit for the third packet.

With the preamp gain switching circuit of the present embodiment, because the first operating unit outputs the first switching element operating signal when the output level of the preamp exceeds the first discrimination level and the timing at which the first discrimination level is exceeded is within the first gain switching period and the second operating unit generates the second switching element operating signal when the output level of the preamp exceeds the second discrimination level, the first switching element operating signal is output, and the timing at which the second discrimination level is exceeded is within the second gain switching period, a preamp gain switching circuit that can perform accurate gain switching in the interval from the head bit to the bit of the predetermined number, switch to an appropriate conversion gain according to the level of the input signal, and realize control without gain switching error can be provided.

Third Embodiment

Figure 7:
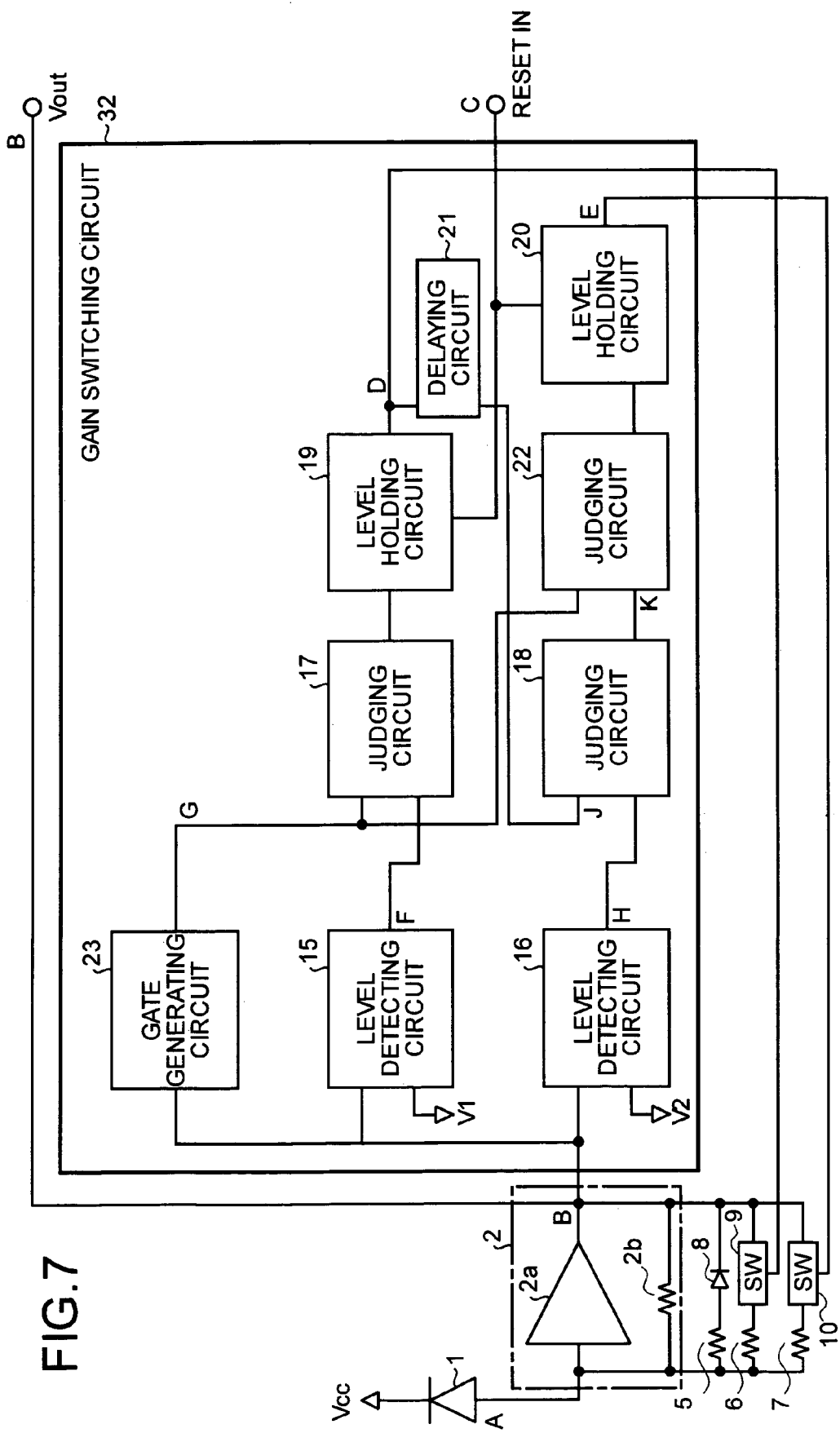
FIG. 7 is a block diagram of an arrangement of a preamp gain switching circuit according to a third embodiment of the present invention.
Figure 8:
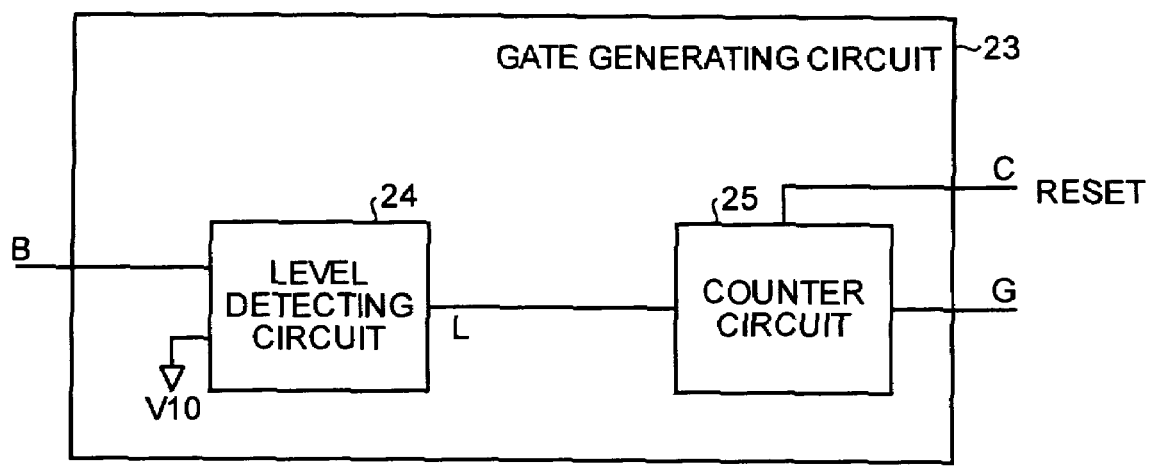
FIG. 8 is a block diagram of an arrangement of a gate generating circuit 23 shown in FIG. 7.

FIG. 7 is a block diagram of an arrangement of a preamp gain switching circuit according to a third embodiment of the present invention. With the gain switching circuit 32 shown in FIG. 7, the gain switching circuit 31 of FIG. 5 is provided additionally with a gate generating circuit 23 that generates a gate signal (GATE) G. Besides this, the arrangement is the same as or equivalent to the arrangement of the gain switching circuit 31 of the second embodiment shown in FIG. 5 and the same symbols are provided to the respective parts. FIG. 8 is a block diagram of an arrangement of the gate generating circuit 23 shown in FIG. 7. The gate generating circuit 23 shown in FIG. 8 has a level detecting circuit 24 and a counter circuit 25.

Figure 9:
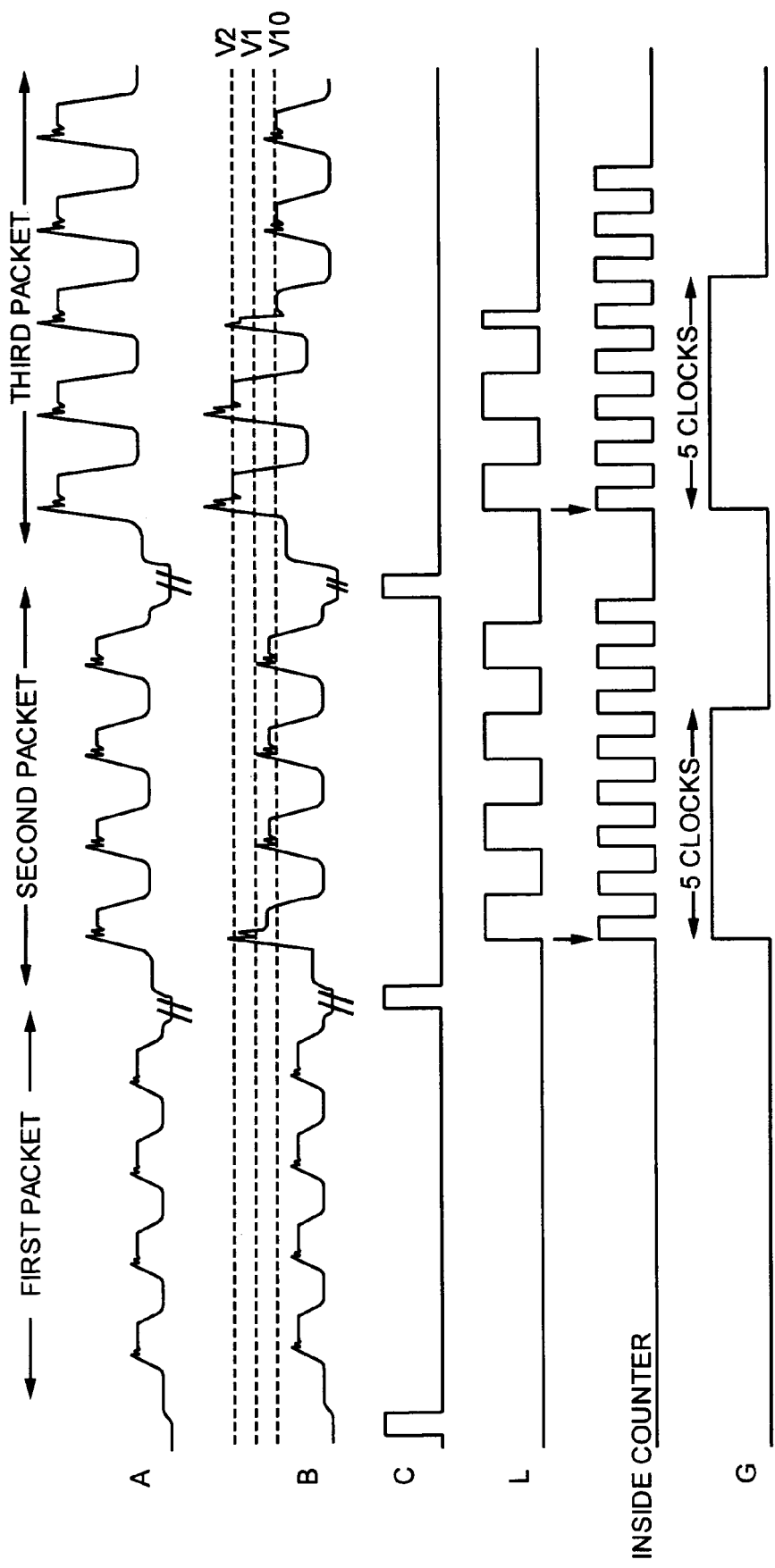
FIG. 9 is a timing chart for explaining operations of the gate generating circuit 23 shown in FIG. 8.

Operations of the gain generating circuit 23 shown in FIG. 8 will now be described with reference to FIGS. 7 to 9. FIG. 9 is a timing chart for explaining the operations of the gain generating circuit 23 shown in FIG. 8. "A" of FIG. 9 depicts a current waveform that is input into the TIA 2 and here, the same signal train as the first to the third packets shown in FIG. 2 is shown.

"B" of FIG. 9 depicts a waveform of the output voltage (Vout) B output from the TIA 2 when the respective packet signals of "A" are input, and the discrimination levels (V10, V1, and V2) are indicated on the waveform. For the first packet, the output voltage (Vout) B of the TIA 2 is of a level less than the discrimination level V10. For the second packet, the output voltage (Vout) B of the TIA 2 is of a level that exceeds the discrimination level V1 and just barely reaches the discrimination level V2. For the third packet, the output voltage (Vout) B of the TIA 2 is of a level that exceeds the discrimination level V2.

"C" of FIG. 9 depicts a waveform of the reset signal (RESET) C. As shown in "C", the reset signal (RESET) C is input at the head of each of the first, the second, and the third packets. By this input, the counter circuit 25 is set to the initialized state at the head of each packet signal.

"L" of FIG. 9 is a waveform diagram depicting operations of the level detecting circuit 24. For the first packet of the example of "B", because the discrimination level V10 is not exceeded, an output pulse is not generated. Meanwhile, for the second packet, because the level exceeds the discrimination level V10, pulses are generated in the period, starting from the first bit and lasting while the discrimination level V10 is exceeded. Because the second packet is of a level that exceeds the discrimination level V1, the SW operating signal D of the gain switching circuit 32 of FIG. 7 is output and the SW 9 is put in the ON state. However, because the second packet is of a level that just barely reaches the discrimination level V2 and because the SW operating signal E is thus not output and the SW 10 remains in the OFF state, output pulses are generated until the reset signal (RESET) C is input. Meanwhile, for the third packet, because the signal exceeds the discrimination level V2, pulses are generated from the first bit. However, after the output of the fifth bit onward, because the SW operating signal D of the gain switching circuit 32 of FIG. 7 is output so that the SW 9 is put in the ON state and the SW operating signal E is also output so that the SW 10 is also put in the ON state, the amplitude of the packet signal that is lowered in gain by the new conversion gain drops to the discrimination level V10 or less. Output pulses are thus not generated from the sixth bit and onward.

A waveform shown between "L" and "G" is that of clocks generated inside the counter circuit 25 (inside a counter) and a waveform shown in "G" is that of the gate signal (GATE) G output from the counter circuit 25. The counter circuit 25 starts the counter with the input of the reset signal (RESET) C and generates a gate signal corresponding to a predetermined number of clocks that has been set in advance (five clocks in the present example). The generated gate signal G is input into the judging circuits 17 and 22 of FIG. 7 and gain switching is performed in accordance with the operations described with the second embodiment.

Though the gate generating circuit must be arranged so that accurate gain switching will be performed at the discrimination levels V1 and V2 at which gain switching is to be performed, this can be realized by arranging so that for V1 and V2 that meet the conditions of the second embodiment, the relationships V10<V1 and V10<V2 are satisfied as well.

With the preamp gain switching circuit of the present embodiment, because upon receiving the output of the preamp, the gate signal for switching to the predetermined conversion gain within the gain switching period is generated, accurate gain switching in the interval from the head bit to the bit of the predetermined number can be performed and a preamp gain switching circuit that can switch to an appropriate conversion gain according to the level of the input signal can thus be provided.

Also, with the preamp gain switching circuit of the present embodiment, because control is performed so that the second switching element is enabled to be closed after the first switching element has been closed within the gain switching period, a preamp gain switching circuit that can realize control without gain switching error can be provided.

Also, with the preamp gain switching circuit of the present embodiment, because the gate signal with the time width corresponding to the predetermined number of clocks is generated using clock signals generated by the counter circuit, a preamp gain switching circuit that can realize control without gain switching error can be provided.

Fourth Embodiment

Figure 10:
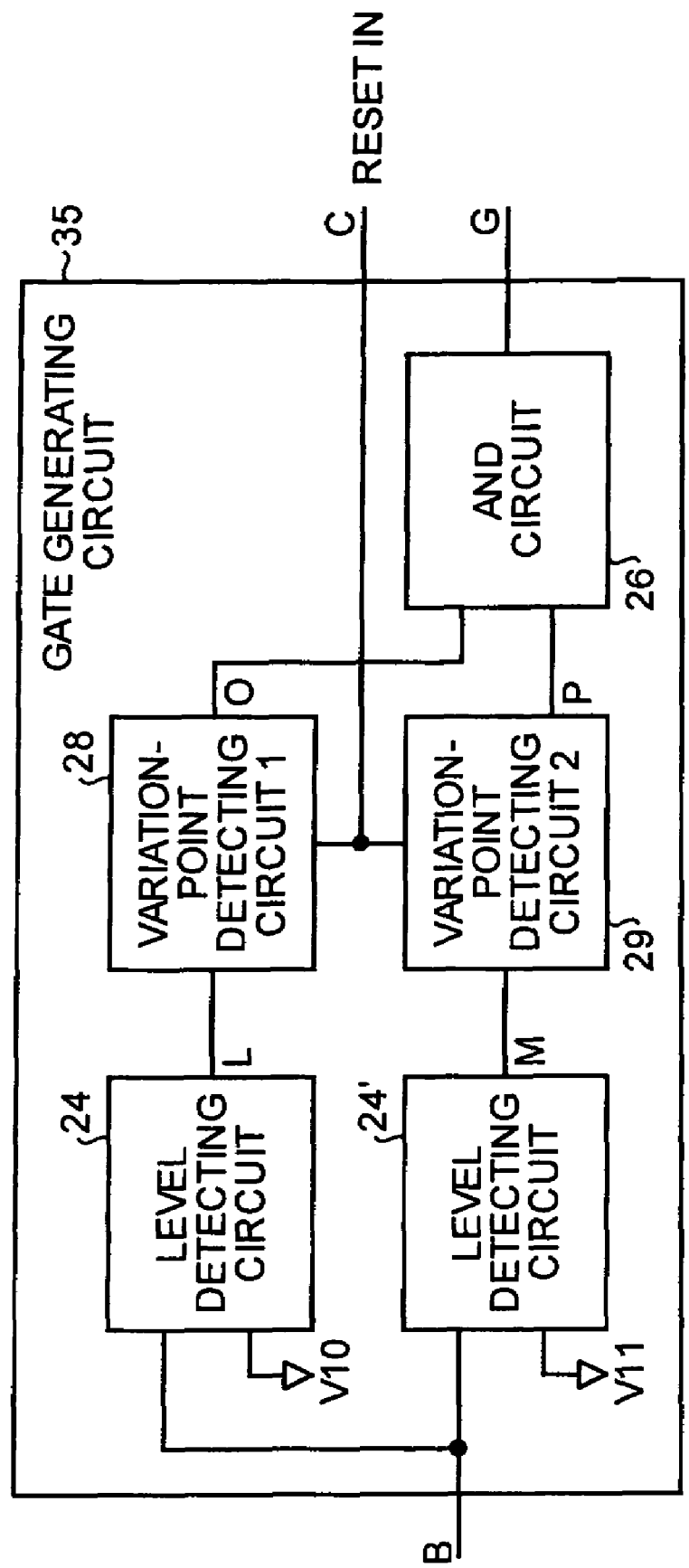
FIG. 10 is a block diagram of an arrangement of a gate generating circuit 35 according to a fourth embodiment of the present invention.

FIG. 10 is a block diagram of an arrangement of a gate generating circuit 35 according to a fourth embodiment of the present invention. The gate generating circuit 35 of the fourth embodiment shown in FIG. 10 is another arrangement example of the gate generating circuit 23 shown in FIG. 8. The gate generating circuit 35 has level detecting circuits 24 and 24', a variation-point detecting circuit 28, which is a first variation-point detecting circuit, a variation-point detecting circuit 29, which is a second variation-point detecting circuit, and a logical product (AND) circuit 26.

In FIG. 10, the output (voltage signal) B of the TIA 2 is input into one of the input terminals of each of the level detecting circuits 24 and 24'. A discrimination level V10, which is the first discrimination level, is input into the other input terminal of the level detecting circuit 24. A discrimination level V11, which is the second discrimination level, is input into the other input terminal of the level detecting circuit 24'.

An output L of the level detecting circuit 24 is input into the variation-point detecting circuit 28. An output M of the level detecting circuit 24' is input into the variation-point detecting circuit 29. The respective outputs of the variation-point detecting circuits 28 and 29 are input into the AND circuit 26. The AND circuit 26 outputs a gate signal (GATE).

Figure 11:
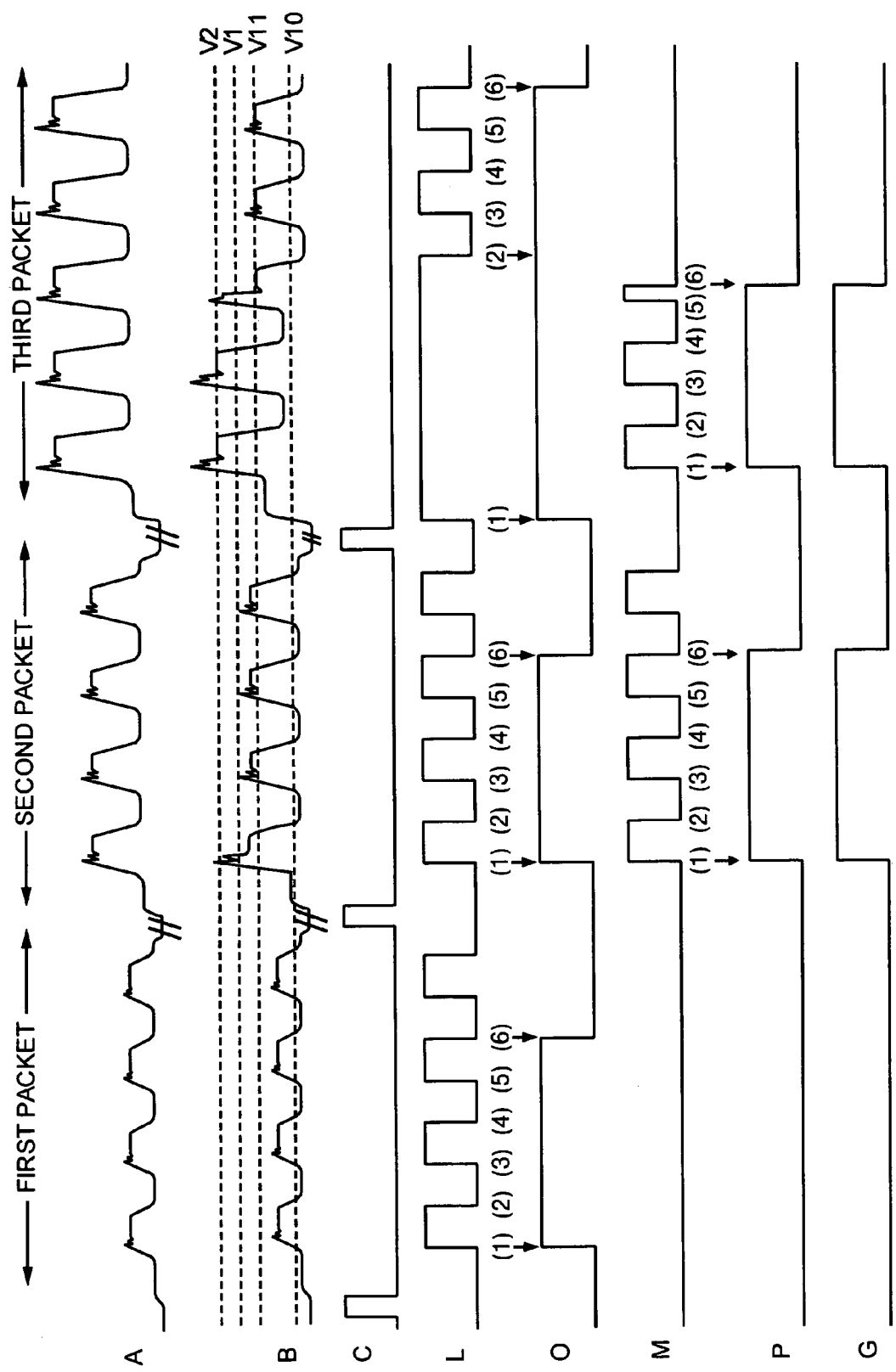
FIG. 11 is a timing chart for explaining operations of the gate generating circuit 35 shown in FIG. 10.

FIG. 11 is a timing chart for explaining operations of the gate generating circuit 35 shown in FIG. 10. "A" of FIG. 11 depicts a current waveform that is input into the TIA 2 and here, the same signal train as the first to the third packets shown in FIG. 9 is shown. "B" of FIG. 11 depicts a waveform of the output voltage (Vout) B output from the TIA 2 when the respective packet signals of "A" are input, and the discrimination levels (V10, V11, V1, and V2) are indicated on the waveform.

"C" of FIG. 11 depicts a waveform of the reset signal (RESET) C. As shown in "C", the reset signal (RESET) C is input at the head of each of the first, the second, and the third packets. By this input, the variation-point detecting circuits 28 and 29 are set to the initialized state at the head of each packet signal.

"L" of FIG. 11 is a waveform diagram depicting operations of the level detecting circuit 24. With the example of "B", because for the first packet, the discrimination level V10 is exceeded, output pulses are generated for the periods in which the discrimination level V10 is exceeded. Pulses are generated likewise for the second packet. Meanwhile, the third packet is a signal that constantly exceeds the discrimination level V2 and from the first bit to the sixth bit of the third packet, a pulse with a wide time width as shown in the figure is generated. At the seventh bit onward, because the SW operating signal D of the gain switching circuit 32 of FIG. 7 is output so that the SW 9 is put in the ON state and the SW operating signal E is also output so that SW 10 is also put in the ON state, the amplitude of the packet signal is lowered by the new, lowered conversion gain. Thus, unlike the pulse generation from the first bit to the sixth bit, output pulses are generated for the periods in which the discrimination level V10 is exceeded.

"M" of FIG. 11 is a waveform diagram depicting operations of the level detecting circuit 24'. For the first packet, because the discrimination level V11 is not exceeded, output pulses are not generated. Meanwhile, for the second packet, because the discrimination level V11 is exceeded, pulses are generated for the periods in which the discrimination level V11 is exceeded. For the third packet, though the signal exceeds the discrimination level V11, unlike the waveform of "L" that results from the comparison with the discrimination level V10, output pulses are generated for the periods in which the discrimination level V11 is exceeded. At the sixth bit and onward, unlike the waveform of "L", output pulses are not generated.

"O" of FIG. 11 is a waveform diagram depicting operations of the variation-point detecting circuit 28. The variation-point detecting circuit 28 counts the leading edges and trailing edges of the output pulses generated by the level detecting circuit 24 and generates a gate signal (referred to hereinafter as the "first basic gate signal") having the first pulse (first count) as the starting point and having a length of predetermined counts of variation points (six counts in the present example) that has been set in advance (the length will be referred to hereinafter as the "predetermined variation point count length"). The gate signal is held until the reset signal (RESET) C is input.

"P" of FIG. 11 is a waveform diagram depicting operations of the variation-point detecting circuit 29. The operation of the variation-point detecting circuit 29 is the same as that of the variation-point detecting circuit 28 and a gate signal (referred to hereinafter as the "second basic gate signal") of the time width shown in "P" (the time width of the predetermined variation point count length) is generated. The gate signal is also held until the reset signal (RESET) C is input.

"G" of FIG. 11 is a waveform diagram depicting operations of the AND circuit 26. The AND circuit 26 determines the logical product of the first basic gate signal and the second basic gate signal to generate a gate signal. The gate signal is input into the judging circuits 17 and 22 of FIG. 7 and gain switching is performed according to the operations described with the second embodiment.

Though the gate generating circuit must be arranged so that accurate gain switching will be performed at the discrimination levels V1 and V2 at which gain switching is to be performed, this can be realized by arranging so that for V1 and V2 that meet the conditions of the second embodiment, the relationships V10<V11<V1 and V10<V11<V2 are furthermore satisfied.

With the preamp gain switching circuit of the present embodiment, because upon receiving the output of the preamp, the gate signal for switching to the predetermined conversion gain within the gain switching period is generated and accurate gain switching in the interval from the head bit to the bit of the predetermined number can thus be performed, a preamp gain switching circuit that can switch to an appropriate conversion gain according to the level of the input signal can be provided.

Also, with the preamp gain switching circuit of the present embodiment, because the logical product signal of the first basic gate signal, generated by the first variation-point detecting circuit and having the time width of the predetermined variation point count length, and the second basic gate signal, generated by the second variation-point detecting circuit and having the time width of the predetermined variation point count length, is generated and the logical product signal is used as the gate signal, a preamp gain switching circuit that can realize control without gain switching error can be provided.

INDUSTRIAL APPLICABILITY

The preamp gain switching circuit according to the present invention is suitable for a preamp used in photoreceiver of an optical communications system or in a photoreceiving unit of an optical signal measuring apparatus, monitor, etc.

The invention claimed is:

1. A gain switching circuit configured to switch a conversion gain of a preamplifier, the preamplifier being configured to output a voltage signal by amplifying an output current of a photo-detecting element configured to convert a burst optical signal into an electrical signal, the preamplifier being configured with a first series circuit formed with a first resistor and a first switching element and a second series circuit formed with a second resistor and a second switching element respectively connected in parallel with a feedback resistor, the gain switching circuit inputting a first gain switching signal defining a period for switching to a first conversion gain and a second gain switching signal defining a period for switching to a second conversion gain, said first gain switching signal and said second gain switching signal originating from outside of the gain switching circuit, the gain switching circuit comprising:

a first operating unit configured to generate a first switching element operating signal to close the first switching element in response to the voltage signal output by the preamplifier being above a first threshold during the period defined by the first gain switching signal originating from outside the gain switching circuit; and a second operating unit configured to generate a second switching element operating signal to close the second switching element in response to the voltage signal output by the preamplifier being above a second threshold during the period defined by the second gain switching signal originating from outside the gain switching circuit.

2. The gain switching circuit according to claim 1, wherein the first gain switching signal defining the period for switching to the first conversion gain is different from the second gain switching signal defining the period for switching to the second conversion gain.

3. The gain switching circuit according to claim 1, wherein the second operating unit is configured to close the second switching element after the first operating unit closes the first switching element.

4. The gain switching circuit according to claim 1, wherein following relation is satisfied $$V1 < kV2$$

where V1 is the first threshold, V2 is the second threshold, and k is an amount of lowering a gain of the preamplifier when the first switching element is closed based on the first threshold.

5. A gain switching circuit configured to switch a conversion gain of a preamplifier, the preamplifier being configured to output a voltage signal by amplifying an output current of a photo-detecting element configured to convert a burst optical signal into an electrical signal, the preamplifier being configured with a first series circuit formed with a first resistor and a first switching element and a second series circuit formed with a second resistor and a second switching element respectively connected in parallel with a feedback resistor, the gain switching circuit comprising:

a gate generating circuit configured to generate a gate signal defining a period for switching to a predetermined conversion gain;

a first operating unit configured to generate a first switching element operating signal to close a first switching element in response to the voltage signal output by the preamplifier being above a first threshold during the period defined by the gate signal generated by the gate generating circuit; and a second operating unit configured to generate a second switching element operating signal to close a second switching element in response to the voltage signal output by the preamplifier being above a second threshold during the period defined by the gate signal generated by the gate generating circuit.

6. The gain switching circuit according to claim 5, wherein the second operating unit is configured to close the second switching element after the first operating unit closes the first switching element.

7. The gain switching circuit according to claim 5, wherein the gate generating circuit includes a counter circuit that generates a clock signal, and the gate generating circuit generates a gate signal having a time width of a predetermined number of clocks by using the clock signal generated by the counter circuit.

8. The gain switching circuit according to claim 6, wherein when the first switching element operating signal is generated using the first threshold and the second switching element operating signal is generated using the second threshold, the gate generating circuit generates the gate signal based on a third threshold and a fourth threshold that satisfy $V10<V11<V1$ and $V10<V11<V2$ where $V1$ is the first threshold, $V2$ is the second threshold, $V10$ is the third threshold, and $V11$ is the fourth threshold.

9. The gain switching circuit according to claim 8, wherein the gate generating circuit includes
   a first variation-point detecting circuit configured to detect a variation point of a signal that is detected at the third threshold; and
   a second variation-point detecting circuit configured to detect a variation point of a signal that is detected at the fourth threshold, and
   the gate generating circuit is configured to generate a logical product signal of a first basic gate signal that is generated by the first variation-point detecting circuit with a time width of a predetermined variation point count length and a second basic gate signal that is generated by the second variation-point detecting circuit with a time width of a predetermined variation point count length as the gate signal.

\* \* \* \* \*